United States Patent [19]

Lymn

[11] Patent Number: 5,554,412
[45] Date of Patent: Sep. 10, 1996

[54] SOLDER SPRAY LEVELLER

[76] Inventor: Peter P. A. Lymn, Limeworks Cottage, Kilm La., Buriton, Petersfield, Hampshire GU32 1ON, United Kingdom

[21] Appl. No.: 146,094
[22] PCT Filed: May 6, 1992
[86] PCT No.: PCT/GB92/00821
§ 371 Date: May 3, 1994
§ 102(e) Date: May 3, 1994
[87] PCT Pub. No.: WO92/19416
PCT Pub. Date: Dec. 11, 1992

[30] Foreign Application Priority Data

May 8, 1991 [GB] United Kingdom .................. 9109899

[51] Int. Cl.⁶ ........................................................ H05K 3/24
[52] U.S. Cl. ................................. 427/96; 118/63; 118/314
[58] Field of Search ........................ 228/37, 260; 118/314, 118/315, 316, 63; 427/96, 97

[56] References Cited

U.S. PATENT DOCUMENTS

| 4,530,457 | 7/1985 | Down | 228/37 X |
| 4,607,590 | 8/1986 | Pender | 118/316 |
| 4,709,846 | 12/1987 | Eidenberg | 228/37 X |
| 4,928,869 | 5/1990 | Lymn | 118/63 X |
| 5,222,650 | 6/1993 | Lymn | 228/20.1 |

Primary Examiner—Kenneth J. Ramsey
Attorney, Agent, or Firm—Ware, Fressola, Van Der Sluys & Adolphson

[57] ABSTRACT

A horizontal solder leveller includes: solder spurge bars (21, 22) for providing downwardly and upwardly directed, distributed flow of solder, as a spray (25), through which a board (1) being tinned can pass to displace oil from contact pads on the board.

18 Claims, 5 Drawing Sheets

SOLDER SPRAY LEVELLER

FIELD OF THE INVENTION

The present invention relates to a horizontal solder leveller.

Background of the Invention

The term "horizontal solder leveller" means a machine through which printed circuit boards and the like (hereinafter called "boards") are passed substantially horizontally for application of molten solder and levelling of the applied solder. Accordingly such a machine comprises at least means for applying molten solder and means for levelling the applied solder. My early horizontal solder leveller is described in specification No. WO 87/07196, published on 3rd Dec., 1987, of my international patent application No: PCT/GB 87/00367, My early horizontal solder leveller relies on passage of the board to be tinned beneath the surface of the molten solder in its solder bath. The board is passed between upper and lower tinning rollers, which at once—I believe—heat the board, assist transfer of solder onto the board and transport the board through the solder.

My early horizontal leveller has been developed as described in specification No: WO 91/06390, published on 16th May 1991, of my international patent application No: PCT/GB 90/01685. The development included the provision of castellations in outfeed rollers for feeding the board from the solder bath to the air knives for levelling the solder applied to the board. The castellations allowed the air flow from the air knives to entrain oil, which can be sprayed onto these rollers, with the solder particles displaced from the board. This has assisted in keeping the machine clean and in returning the solder particles to the solder bath.

U.S. Pat. No. 4,563,974, issued on 14th Jan. 1986 to Monitrol, Inc., describes a horizontal solder leveller in which solder is poured onto the top surface of the board and is applied to the bottom surface of the board by a lower tinning roller. The solder application occurs entirely within flux oil and oil levelling is used.

Where boards include small pads for soldered contact with components, especially where the pads are for surface mount components, i.e. the pads do not have an associated bore through the board for a wire of the component to be soldered; a problem in tinning particularly with a horizontal leveller can arise of the solder not wetting some of the contact pads. I believe that this non-wetting results from the flux oil with which the board is preliminarily coated not being displaced by the solder.

It is conventional to include volatile chemicals in the flux oil. These are intended to vaporize as the board approaches the eutectic temperature of the solder and thus displace the oil from the contact pads. I have carried out extensive trials on these chemicals and concluded that they cannot be a complete solution to the problem of board pads not being completed wetted by solder in a horizontal leveller.

The Invention

I now pass the boards through a solder curtain or spray immediately upstream of the main solder application means in my present solder leveller, which is developed as mentioned and includes my present invention. Such a curtain or spray appears to assist the displacement of the oil and allow its replacement with the solder in the application means.

Vertically upwards flow has a more beneficial effect than downwards flow. I believe that this is because displacement of oil from contact pads on the underside of the board is inherently more difficult. The oil can not float away vertically once trapped beneath a substantially horizontal board. An upwards flow of solder onto these pads forcibly displaces oil from them.

Accordingly the horizontal solder leveller of my new invention includes:

means for providing an upwardly directed, distributed flow of solder, as a spray or curtain, through which the boards can pass.

Normally the solder spray or curtain means will provide both upwards and downwards solder flow onto the board.

Whilst the solder spray or curtain can be used as an auxiliary solder application means in a solder leveller provided with main solder application means such as the tinning rollers of my present horizontal leveller, my new invention extends to the entire solder application means of a horizontal leveller being by solder spray or curtain. In this case, both upwards and downwards solder flow will be provided. These flows will, I envisage, be provided at a plurality of stations.

Despite the resultant risk of oxidation of the solder and dross formation, I prefer to provide the solder spray or curtain prior to immersion of the board in oil or molten solder. This allows the displaced oil to more readily move sideways from the contact pads.

It is not necessary for an entire pad to be wetted with solder by the or the first solder spray. The beneficial effect of the invention will be obtained if a small portion of a pad has been wetted, I believe, because once the board is within the main application means, or a following spray or curtain, solder will readily wet the rest of the pad.

An incidental advantage of the invention is the ability to use an oil which has fewer added chemicals.

Conveniently the solder spray or curtain means includes at least one spurge bar arranged beneath the path taken by the board. Where both upper and lower sprays are to be provided, upper and lower solder spurge bars will be provided. Normally solder will be pumped from a solder bath to the spurge bars and will flow back to the bath for recirculation.

The spurge bar(s) may have a single slot extending along its length. However I prefer to provide a plurality of nozzles distributed along the length of the bar. They provide a more turbulent flow of solder, whose turbulence I believe increases the oil displacement effect of the flow of solder.

The solder spray or curtain means may direct the solder with a component of average flow direction opposed to the direction of travel of the board through the solder. This I believe enhances the oil displacement effect, in pushing the oil back against the movement of the board, as opposed to allowing the oil to become drawn in under and trapped within the solder. In my present solder leveller, the board has a downwards component of direction as it approaches the solder application means, so that the vertical upwards flow of the solder has a component of direction backwards with respect to the board direction.

In my present solder leveller, the solder spray spurge bars are provided discretely from the main solder application means, although in close proximity with it in order to minimise cooling and/or oxidisation effects prior to entry of the board into the main solder application means. With such an arrangement, a separate solder bath may be provided from which the solder for the spray is pumped and to which it flows back. However in my present leveller, the spurge bars are closely associated with the main solder application means. They are arranged above the upstream end of the main (and only) solder bath so that the solder from the spray returns directly to the bath. A pump pumps solder directly from the bath to the spurge bars.

In my envisaged leveller described in more detail below, I will provide a plurality of upper and lower solder sprays or curtains from upper and lower spurge bars. The bars may have nozzles or slots or a combination of both for establishing the sprays or curtains. Between each upper and lower spurge bar pair, transport roller pairs will be provided. A solder bath will be provided below the spurge bars for collecting the excess solder. Unlike the tinning rollers of my present machine, the transport rollers will not run in the molten solder in the bath; although the lower rollers will run in oil over the solder to maintain them evenly heated and clean. Above the solder spurge bars and the transport rollers, oil spurge bars will be provided for heating the upper rollers with pumped oil and keeping them and the machine generally clean.

According to another aspect of the invention there is provided a method of tinning a board in a horizontal solder leveller, the method including the preliminary tinning step of subjecting the board to an upwardly directed, distributed flow of solder, as a spray or curtain, through which the board passes.

Preferably, the subjection of the board to the upwards flow of solder is prior to its immersion in oil or molten solder.

To help understanding of the invention, two solder levellers embodying the invention will now be described by way of example and with reference to the accompanying drawings, in which:

THE DRAWINGS

THE FIRST PREFERRED EMBODIMENT

Figure 1:
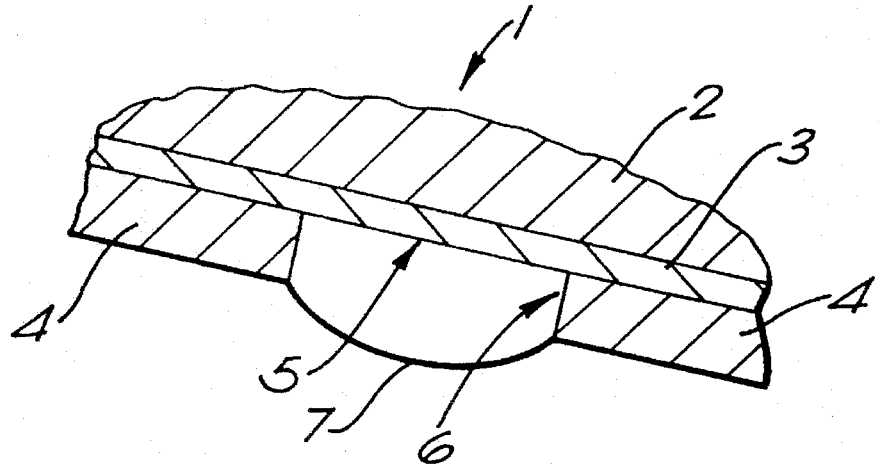
FIG. 1 is a scrap cross-sectional view on an enlarged scale of a contact pad of a printed circuit to be tinned.
Figure 3:
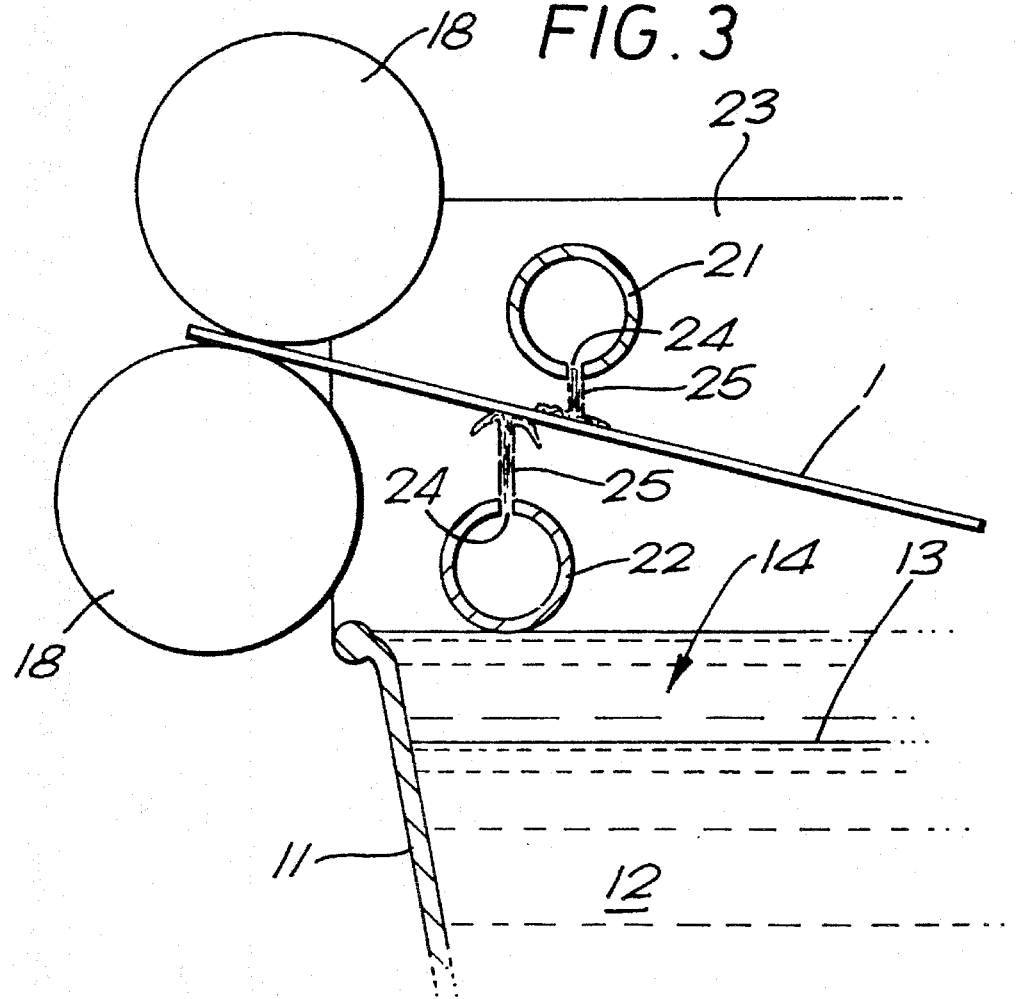
FIG. 3 is a similar view on a larger scale of solder spray spurge bars in the solder leveller of FIG. 1.
Figure 2:
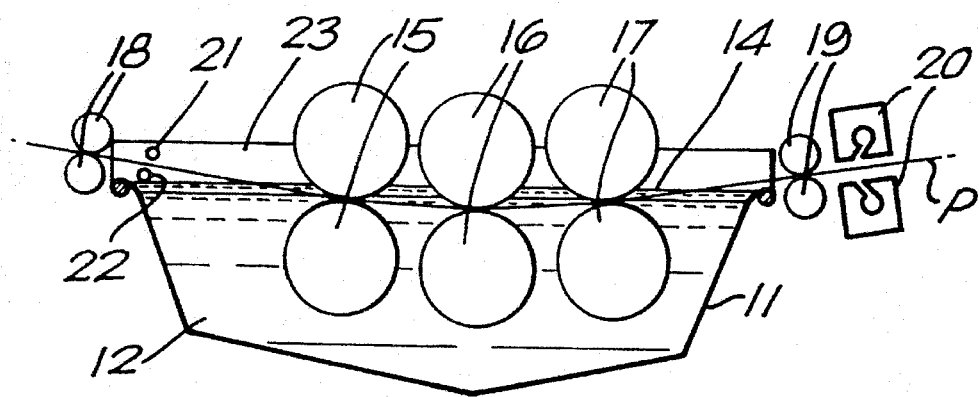
FIG. 2 is a diagrammatic side view of one solder leveller of the invention.
Figure 4:
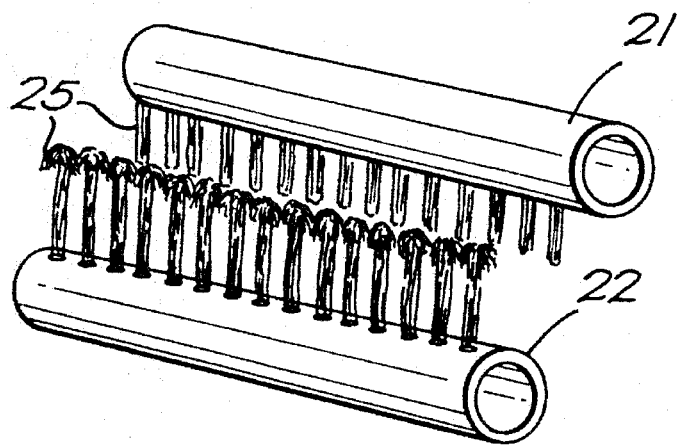
FIG. 4 is a scrap perspective view of solder spray flow from the spurge bars.

Referring first to FIG. 1, there is shown the underside of a printed circuit board 1 at an angle of 8°, at which is approaches the solder bath 11 of the solder leveller shown in FIG. 2. On the substrate 2 of the board is laid a copper track 3 partially over-laid by a photo-resist mask 4 to leave exposed a contact pad 5. The board has been previously coated with an oil. This does not adhere to the mask 4, but does adhere to the contact pad 5 and completely fills the cavity 6 defined by the mask and the pad. The oil forms a meniscus 7 from the edges of the mask at the cavity. The surface tension of the oil is such that the cavity remains filled even when as shown in FIG. 1 the board is upside down. In a solder leveller such as described in my International patent application No: PCT/GB 89/01685, dated 2nd Nov. 1990, the oil in the cavity may be dragged under the surface of the solder and prevent the pad from being wetted by the solder.

Turning no to FIG. 2, the leveller there shown can be seen to have a bath 11 containing molten solder 12 having a free surface 13, over which there is a layer of oil 14. The leveller has three pairs of tinning rollers 15, 16, 17 having nips beneath the surface 13 of the solder. An infeed roller pair 18 and an outfeed roller pair 19 are provided. The rollers by their nips define a curved board path P through the leveller. Air knives 20 for levelling solder applied to a board during its passage through the bath via the rollers are provided downstream of the bath.

Above the solder and immediately downstream of the infeed rollers, two solder spurge bars 21, 22 are provided. They are mounted in side walls 23 of the bath and extend transversely across the width of the board path, the upper bar 21 being above the board path and the lower bar 22 being below the path. The lower bar 22 is marginally upstream, in the sense of the movement of the board along the board path P, of the upper bar 21 whereby solder streams from each do not interfere with each other. The bars are in fact hollow tubes and are connected to a pump (not shown) for pumping solder from the bath to them. Along their length, the bars are provided with a plurality of apertures 24 through which the solder leaves them as a curtain or screen of individual streams 25. The apertures in the lower bar are directed upwardly and those in the upper bar are directed downwardly, to give a corresponding direction to the streams 25. Typically the apertures are of 1.5 mm diameter set at 3.0 mm pitch. The pressure, with which the solder is pumped, is sufficient to cause the jets from the lower bar to rise above the level of the board path between the spurge bars.

Previously to reaching the infeed rollers 18, a board to be tinned and levelled is coated with oil including flux to aid the tinning process. It is this oil which the invention removes from the contact pads, as opposed to the oil 14 overlying the solder 12 in the bath 11. Being comprised of a plurality of streams 25, the solder flow is turbulent and spreads in an uneven way over the upper and lower surfaces of the board 1 at the spurge bars 21, 22. In so doing, it disturbs the oil menisci such as 7, and enters the cavities as far as the contact pads such as 5. The pads are likely to be only partially wetted by the solder at this stage. Complete tinning and formation of the intermetallic layer between the copper and the tin of the tin/lead solder occurs during the passage through the main solder bath 11.

Figure 5:
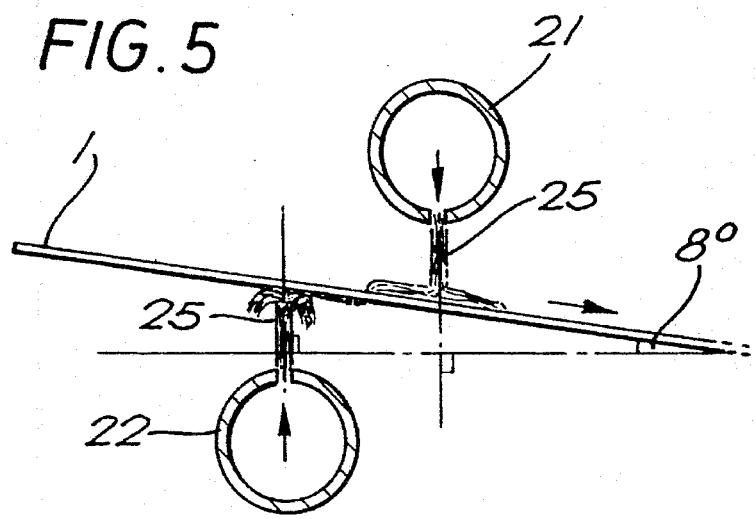
FIG. 5 is a scrap side view of the solder spray flow impinging on a board.

It will be seen from FIG. 5, that the generally vertical direction of the solder streams in combination with the angle of the board at the spurge bars, i.e. inclined downwards by 8°, causes the underneath, upwardly flowing streams to have a component of velocity backwards with respect to the forwards velocity of the board along the local direction of the board path. The upper spurge bar may be turned to give a similar effect.

The solder from the spurge bar streams falls back from the board 1 through the oil layer 14 into the bulk of the solder 12 in the bath 11. From the spurge bars 21, 22 the board passes on along the board path P through the oil 14 into the solder 12 for tinning and thence to the air knives 20.

THE SECOND PREFERRED EMBODIMENT

Figure 6:
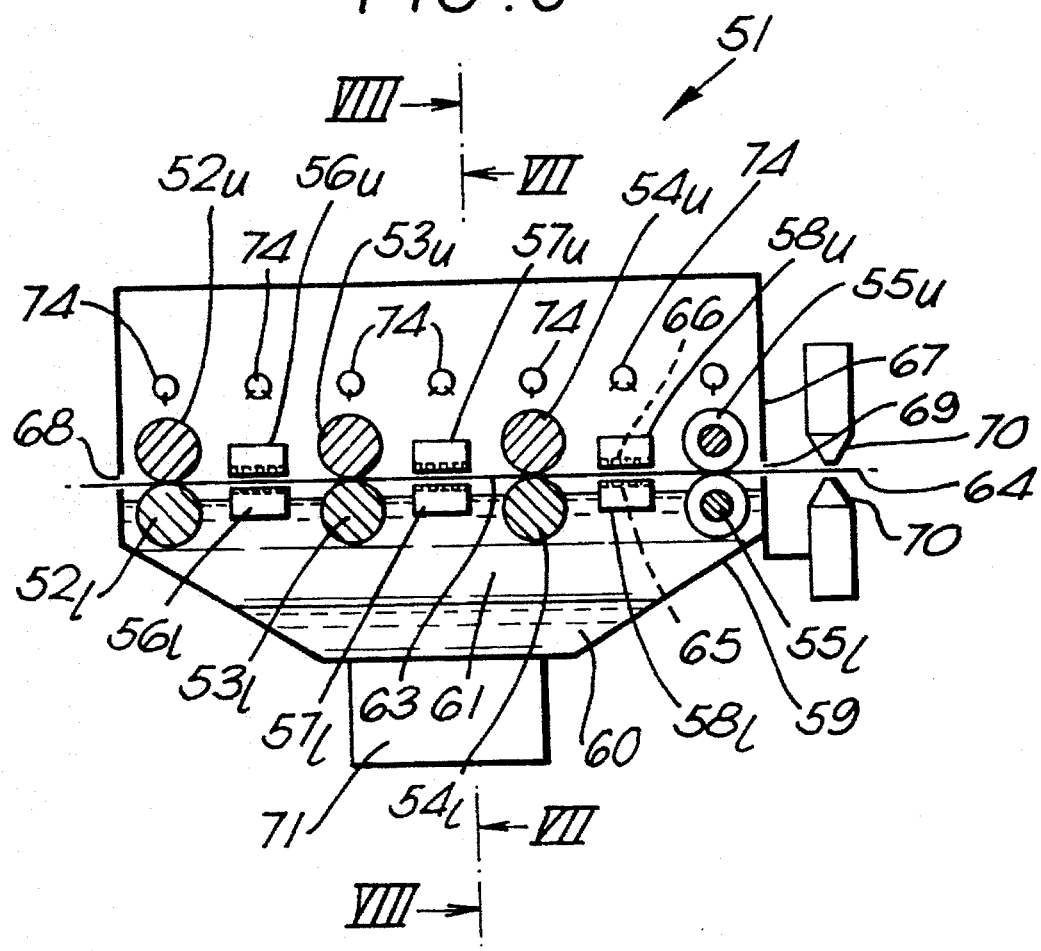
FIG. 6 is a diagrammatic cross-sectional side view of another solder leveller of the invention, taken on the line VI—VI in FIG. 7, without its solder and oil pumps being shown.
Figure 7:
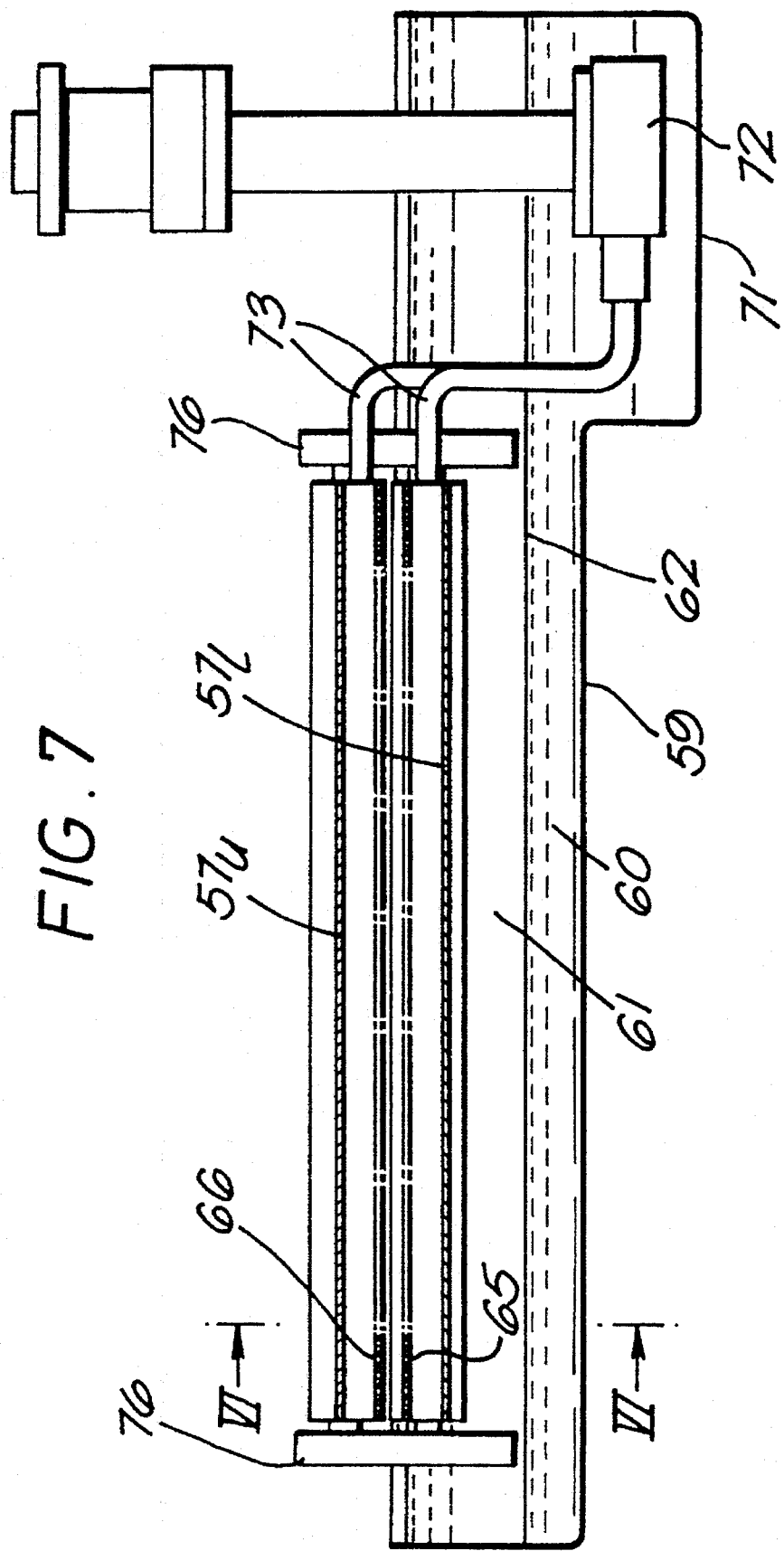
FIG. 7 is a diagrammatic cross-sectional view on the section line in FIG. 6, taken in the direction of the arrows VII—VII, and showing a solder pump.
Figure 8:
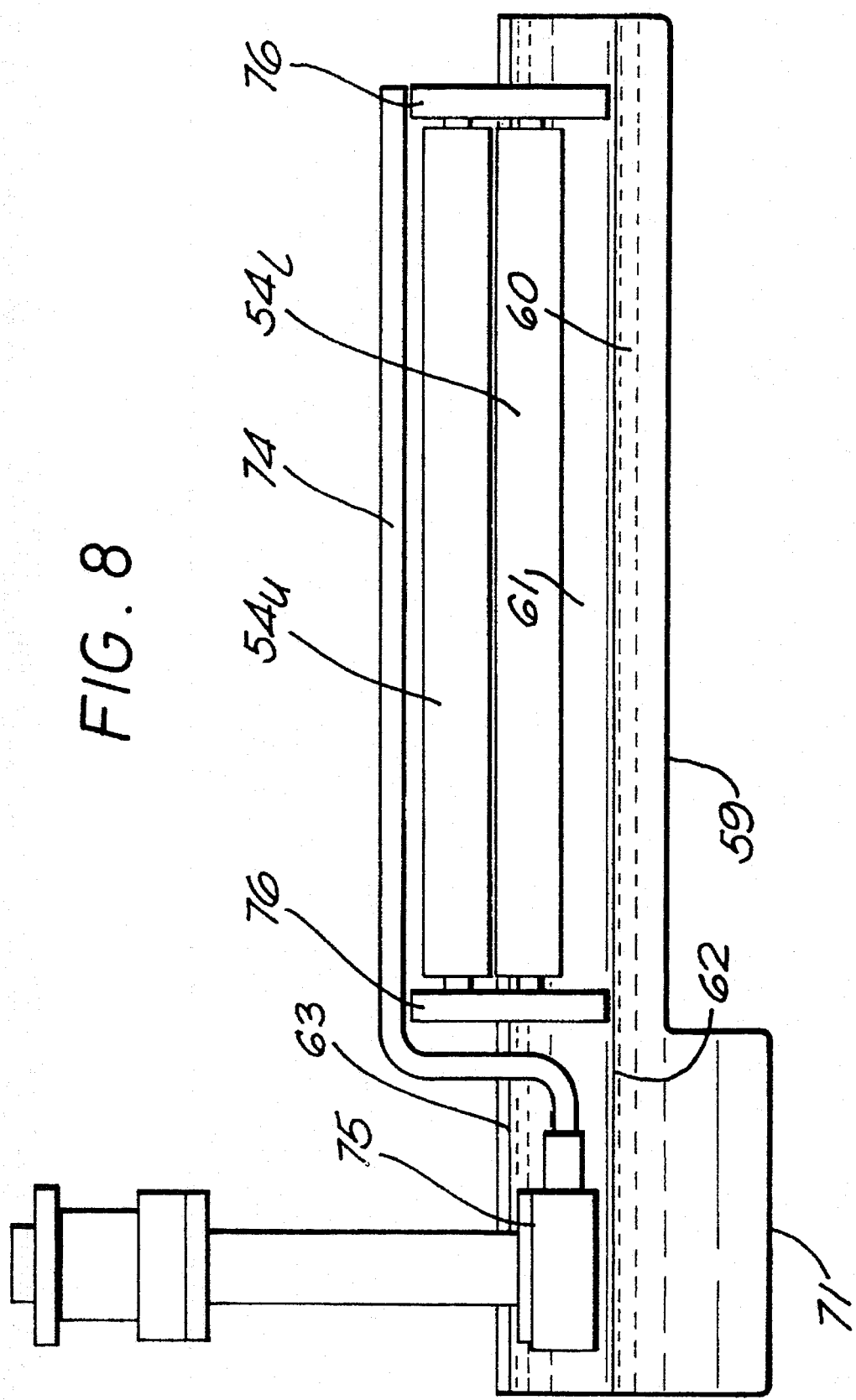
FIG. 8 is a view similar to FIG. 7, taken on the same section line in FIG. 6 but in the opposite direction, i.e in the direction of the arrows VIII—VIII, and showing an oil pump.

Turning not to FIGS. 6, 7, & 8, the solder leveller 51 thereshown utilizes solder sprays alone for applying solder. The leveller has four pairs of upper and lower transport rollers $52_u$, $52_l$, $53_u$, $53_l$, $54_u$, $54_l$, $55_u$, $55_l$ and three pairs of upper and lower spurge bars $56_u$, $56_l$, $57_u$, $57_l$, $58_u$, $58_l$. The lower ones of both of these are set at the top of a sump 59 for containing molten solder 60 and flux oil 61. The top normal level 62 of the solder in the sump 59 is well below the rollers; but the normal top level 63 of the oil is close to the top of the sump 59, with the lower rollers three quarters immersed in the oil 61. The lower spurge bars are are also three quarters immersed in the oil. However it should be noted that the oil does not extend as high as the nip of the rollers at the level 64 of which boards pass through the leveller; nor does the oil cover the apertured top surface 65 of the lower spurge bars, let alone the apertured bottom surface 66 of the upper spurge bars. The spurge bars are hollow tubes with a multi-row array of apertures in their surfaces 65, 66. They are of a material not wetted by solder, as are the transport rollers.

A cowl 67 with air extraction apparatus (not shown) is provided over the sump and defines with it a board inlet 68 and a board outlet 69. Just downstream of the outlet 69, air knives 70 are provided, which direct levelling air at a board leaving the leveller. Due to the angling of the air orifices in the knives, most of the air flow from the knives 70 passes into the cowl 67, via the board outlet 69. The outfeed ones $55_u$, $55_l$ of the transport rollers are castellated to allow passage of this air flow.

The solder sump has a read extension in the form of a tank 71 in which is accommodated a solder pump 72 for drawing solder from the sump and passing it via pipes 73 to the upper and lower solder spurge bars. Provided above the rollers and the solder spurge bars are oil spurge bars 74, which are apertured to spray oil onto the upper rollers and to both sides of the spurge bars, to keep the rollers hot and clean and to keep the boards hot and coated in oil. The oil spurge bars are supplied with oil from an upper portion of the solder tank 71 via an oil pump 75. As shown in FIGS. 7 and 8, the solder spurge bars and the rollers extend between and are supported by side beams 76. The oil spurge bars are supported above the side beams. The entire sump and hence the solder and oil are heated by electric elements, which are not shown.

In use, both pumps 72, 75 are in operation. A pre-fluxed board enters the leveller via the inlet 68 and passes into the nip of the first rollers $52_u$, $52_l$. Thence it is passed on by the rollers, which are driven by non-shown drive arrangements, to the space between the first of the solder spurge bars $56_u$, $56_l$ from which a spray of solder impinges on the board from above and below. The board's contact pads are contacted with solder, but not in sufficient quantity to cover them fully to a depth from which they can be levelled to a uniform solder thickness. The board is passed on to the second and third solder spurge bar pairs $57_u$, $57_l$, $58_u$, $58_l$ by the transport rollers $53_u$, $53_l$, $54_u$, $54_l$, $55_u$, $55_l$. Once the board passes out of the outlet 69, sufficient thickness of solder has built up from the second and third spurge bars for it to be levelled by the air knives 70. The oil spray from the oil spurge bars 74 maintain the upper rollers and the board above the eutectic point of the solder, keep the rollers clean from oxide deposit and entrain solder particles passing within the cowl from the levelling by the air knives.

I claim:

1. A horizontal solder leveller for applying molten solder to a board comprising:

main solder application means for applying molten solder to said board;

outfeed rollers at a downstream end of said main solder application means for feeding said board therefrom;

levelling means downstream of said outfeed rollers for levelling said molten solder applied to said board;

auxiliary solder application means in close proximity upstream of said main solder application means in the direction of travel of said board through said leveller for providing an upwardly directed, distributed flow of molten solder, as a spray or curtain, through which said board can pass, so as to remove any residual flux oil remaining on said board.

2. A horizontal solder leveller according to claim 1, wherein said auxiliary solder spray or curtain means is adapted to provide both upwards and downwards solder flow onto said board.

3. A horizontal solder leveller according to claim 1, wherein said main solder application means comprises tinning rollers.

4. A horizontal solder leveller according to claim 1, wherein said main solder application means comprise further solder spray or curtain means, said auxiliary and said main solder spray or curtain means being provided at a plurality of stations.

5. A horizontal solder leveller according to claim 4, including transport roller pairs provided between said solder spray or curtain stations for transporting said board through said leveller.

6. A horizontal solder leveller according to claim 5, wherein said solder leveller includes a solder bath, and said solder bath is adapted to contain oil over said molten solder and for lower ones of said transport roller pairs to run in said oil.

7. A horizontal solder leveller according to claim 6, including oil spurge bars above said transport rollers and a pump for pumping oil from said solder bath to said spurge bars.

8. A horizontal solder leveller according to claim 1, wherein said auxiliary solder spray or curtain means is adapted to provide said solder spray or curtain prior to the molten solder being applied to said board by said main solder application means.

9. A horizontal solder leveller according to claim 1, wherein said auxiliary solder spray or curtain means includes at least one spurge bar arranged beneath a path taken by said board through said leveller.

10. A horizontal solder leveller according to claim 9, wherein said auxiliary solder spray or curtain means includes at least one spurge bar arranged above said path taken by said board.

11. A horizontal solder leveller according to claim 10, wherein said at least one solder spurge bar includes one or more slots and/or a plurality of nozzles from which said solder spray or curtain flows.

12. A horizontal solder leveller according to claim 9, wherein said at least one solder spurge bar includes one or more slots and/or a plurality of nozzles from which said solder spray or curtain flows.

13. A horizontal solder leveller according to claim 1, wherein said auxiliary solder spray or curtain means is adapted to direct said solder spray or curtain with a component of average flow direction opposed to a direction of travel of said board through said solder.

14. A horizontal solder leveller according to claim 1, wherein said solder leveller includes a solder bath, and said auxiliary spray or curtain means includes a pump for pumping solder from said solder bath to said solder spray or curtain.

15. A horizontal solder leveller according to claim 1, including infeed transport rollers upstream of said solder spray or curtain means for feeding said board into said leveller.

16. A horizontal solder leveller according to claim 1, wherein said levelling means is an air levelling means, and wherein the horizontal solder leveller further includes a cowl enclosing at least said outfeed rollers and said auxiliary solder spray or curtain means and means for extracting levelling air from said cowl, said outfeed rollers being castellated to allow passage of levelling air from said air levelling means.

17. A method of tinning a board in a horizontal solder leveller, comprising the steps of:
1) preliminarily tinning the board with an upwardly directed, distributed flow of molten solder, as a spray or curtain, through which the board can pass, so as to remove any residual flux oil remaining on the board;
2) applying molten solder to the board at a main solder application area;
3) feeding the board away from the main solder application area by means of outfeed rollers; and
4) levelling the molten solder applied to the board.

18. A method according to claim 17, further including the step of immersing said board in oil or molten solder after said preliminary tinning step.

* * * * *

UNITED STATES PATENT AND TRADEMARK OFFICE
CERTIFICATE OF CORRECTION

PATENT NO. : 5,554,412
DATED : September 10, 1996
INVENTOR(S) : Peter P.A. Lynn

It is certified that error appears in the above-indentified patent and that said Letters Patent is hereby corrected as shown below:

```
Col. 6
Claim 1, line 14, please delete "any".
Col. 8
Claim 17, line 6, please delete "any".
```

Signed and Sealed this

Sixth Day of May, 1997

*Attest:*

*Attesting Officer*

BRUCE LEHMAN

Commissioner of Patents and Trademarks